(12) United States Patent
Fleckenstein et al.

(10) Patent No.: US 12,093,161 B2
(45) Date of Patent: Sep. 17, 2024

(54) DEBUG TRACE FABRIC FOR INTEGRATED CIRCUIT

(71) Applicant: Apple Inc., Cupertino, CA (US)

(72) Inventors: Charles J. Fleckenstein, Portland, OR (US); Ori Isachar, Herzliya (IL); Tal Lazmi, Herzliya (IL)

(73) Assignee: Apple Inc., Cupertino, CA (US)

( * ) Notice: Subject to any disclaimer, the term of this patent is extended or adjusted under 35 U.S.C. 154(b) by 633 days.

(21) Appl. No.: 17/326,114

(22) Filed: May 20, 2021

(65) Prior Publication Data

US 2022/0374326 A1    Nov. 24, 2022

(51) Int. Cl.
| | |
|---|---|
| *G06F 11/30* | (2006.01) |
| *G01R 31/317* | (2006.01) |
| *G06F 11/34* | (2006.01) |
| *G06F 13/40* | (2006.01) |

(52) U.S. Cl.
CPC ...... *G06F 11/348* (2013.01); *G01R 31/31705* (2013.01); *G06F 11/3003* (2013.01); *G06F 11/3065* (2013.01); *G06F 11/3485* (2013.01); *G06F 11/349* (2013.01); *G06F 11/3495* (2013.01); *G06F 13/4022* (2013.01); *G06F 13/4027* (2013.01)

(58) Field of Classification Search
CPC .................................................. G06F 11/348
See application file for complete search history.

(56) References Cited

U.S. PATENT DOCUMENTS

2019/0196931 A1    6/2019  Kuehnis et al.
2019/0303268 A1*  10/2019  Ansari ................. G06F 30/34

FOREIGN PATENT DOCUMENTS

| JP | 5329743 B2 | 10/2013 |
|---|---|---|
| WO | 201411579 A2 | 1/2014 |

* cited by examiner

*Primary Examiner* — Phuong Huynh
(74) *Attorney, Agent, or Firm* — Kowert, Hood, Munyon, Rankin & Goetzel, P.C.; Dean M. Munyon

(57) ABSTRACT

A trace network for debugging integrated circuits is disclosed. At least one functional network includes a plurality of components interconnected by a number of network switches, implemented on at least one integrated circuit. A trace network is also implemented on the at least one integrated circuit, and includes a plurality of trace circuits configured to generate trace data based on transactions between ones of the plurality of components. The plurality of trace circuits are coupled to one another by a plurality of trace network switches. The trace circuits are configured to convey the generated trace data to an interface, via the trace network, without using the at least one functional network.

20 Claims, 7 Drawing Sheets

DEBUG TRACE FABRIC FOR INTEGRATED CIRCUIT

BACKGROUND

Technical Field

This disclosure is directed to integrated circuits, and more particularly, to mechanisms for debugging integrated circuits.

Description of the Related Art

Many integrated circuits include hardware debug circuitry. The debug circuitry, which may also be referred to as trace circuitry, may provide access to points within an integrated circuit by, e.g., an external debugger, to allow observation of its internal operation. The debug circuitry within an integrated circuit may allow access to, e.g., registers and other memory circuits therein as well as providing information usable to determine an internal state of the integrated circuit at a particular time. Providing visibility to observe the internal operation of an integrated circuit may, e.g., aid in finding problems, design verification, assessing software issues, and providing information usable for future revisions.

SUMMARY

A trace network for debugging integrated circuits is disclosed. In one embodiment, at least one functional network includes a plurality of components interconnected by a number of network switches, implemented on at least one integrated circuit. A trace network is also implemented on the at least one integrated circuit, and includes a plurality of trace circuits configured to generate trace data based on transactions between ones of the plurality of components. The plurality of trace circuits are coupled to one another by a plurality of trace network switches. The trace circuits are configured to convey the generated trace data to an interface, via the trace network, without using at least one functional network.

In one embodiment, the trace network also includes a trace controller. Trace data may be conveyed to the trace controller, via the trace network, in packets of varying sizes. The trace controller may assemble the packets received from different ones of the trace circuits into frames, which also may vary in size. The frames may then be sent to a host computer (e.g., a debugger) external to the integrated circuit, via an interface.

In some embodiments, the trace network and at least one functional network may be extended to one or more additional integrated circuit dies of a scalable system. Irrespective of the number of integrated circuit dies in a particular embodiment, trace data may be conveyed through the trace network without using (and thus, independent of) any of the one or more functional networks implemented on the IC die(s). In this manner, trace data traffic does not perturb the movement of traffic in the functional network(s).

BRIEF DESCRIPTION OF THE DRAWINGS

The following detailed description makes reference to the accompanying drawings, which are now briefly described.

DETAILED DESCRIPTION OF EMBODIMENTS

Figure 1:
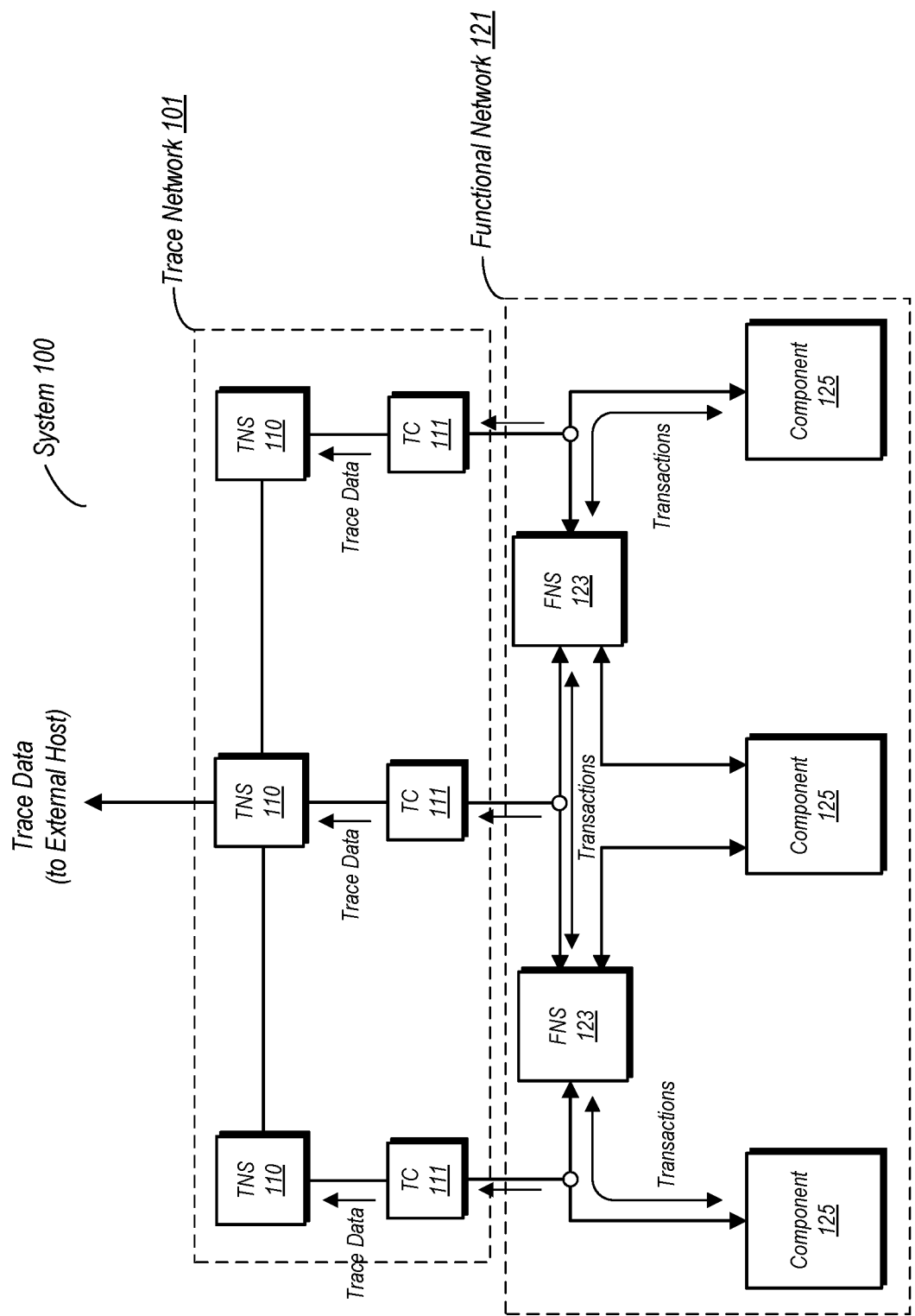
FIG. 1 is a block diagram of one embodiment of a system having a trace network and a functional network.

Various types of integrated circuits (ICs), such as processors and system-on-a-chip (SoC) ICs have debug circuitry implemented thereon. The debug circuitry may be used to, e.g., access internal states of an IC during debugging operations. Debug circuitry in various ICs includes trace circuitry used to monitor transactions between various on-chip functional circuit units. Data from these transactions may be offloaded to, e.g., a host computer (used as a debugger) for further analysis.

In recent years, the complexity of various ICs/SoCs has significantly increased. Some SoCs have a number of parallel communications networks/fabrics each interconnecting a number of different agents such as processor cores, input/output (I/O) circuits, graphics processing units (GPUs), and so on. These networks may generate a large amount of traffic at any given time. Using traditional debug mechanisms to capture trace traffic can disrupt traffic on the SoC or IC undergoing debug. This, in turn, may impede the ability to actually perform debug operations.

The present disclosure contemplates a separate trace network that is in parallel with other networks implemented on an IC/SoC. The trace network includes a number of trace circuits that serve as visibility points from which traffic/transactions may be observed, with the trace circuits interconnected by a number of trace network switches. Transactions between agents on the other networks may be observed by the trace circuits, with these transactions being used in forming trace data. The trace data may be conveyed to, e.g., a trace controller via the trace network and thus without using any of the other functional networks implemented on the IC/SoC. Accordingly, operation of the other networks is not impacted by the moving of trace data due to the presence of a separate trace network. The trace data may be conveyed from the trace controller, via an interface in the IC/SoC, to an external debugger where the transactions comprised within the trace data may be analyzed.

As used herein, the term trace data is defined as information including data from transactions conveyed between various functional circuit blocks in a given network in accordance with this disclosure. The trace data may also include various types of metadata. In some embodiments, at least some metadata may be included as part of the transaction data that is conveyed between the various agents of the system. In some embodiments, at least some metadata may be added by trace circuits which monitor and receive the transaction data. The metadata may include information such as a transaction source, a destination, timestamp, data type, or any other information that further defines the transaction and/or contributes to its completion.

The following discussion begins with a basic overview of a system having a trace network and a functional network. Various embodiments of a system having a trace network and multiple functional networks are then discussed, including embodiments implemented on one or more IC dies. A method for operating a trace network is then described, followed by a description of an example system.

System with Trace Network:

FIG. 1 is a block diagram of one embodiment of a system having a trace network and a functional network. System 100 in the embodiment shown is a simplified diagram of a system that may be implemented on one or more integrated circuits, e.g., one or more system-on-a-chip (SoC) integrated circuits.

System 100 as shown in FIG. 1 includes a trace network 101 and a functional network 121. The functional network 121 includes a number of components 125 that are coupled to one another by a number of functional network switches 123. The components 125 may be various ones of a number of different types of functional circuit blocks that carry out the various operations of system 100. For example, in various embodiments, components 125 may include processor cores, graphics processing units, input/output (I/O) circuits, and so on. These various components 125 may communicate with one another via the illustrated communications paths and the functional network switches 123. Thus, in at least some embodiments, functional network switches 123 may facilitate communications between any two components 125 that are a part of functional network 121. In various embodiments, the functional network(s) may implement a portion of a computer system.

Trace network 101 in the embodiment shown may facilitate debug of the integrated circuit(s) upon which functional network 121 is implemented. Trace network 101 includes a number of trace circuits 111, and a number of trace network switches 110. The trace circuits 111 in the embodiment shown are arranged to generate trace data that may be forwarded to an external host computer (e.g., a debugger) for further analysis. In the generation of trace data, the trace circuits may monitor and read data from transactions conducted between correspondingly coupled ones of the components 125 of functional network 121. The trace data may also include metadata, such as the source of a transaction, the destination of the transaction, various timestamps (e.g., the time a transaction was sent from the source, the time it was acknowledged as received, etc.), and/or other pertinent metadata. The trace data may then be arranged into packets by the trace circuits 111, and routed, via ones of the trace network switches 110, to the external host.

The presence of trace network 101 as disclosed herein may allow for the observing of one or more additional functional networks in a system without impacting its operation. The trace circuits 111 may provide a point of observation for traffic/transactions between various ones of components 125 of a functional network 121. However, the movement of corresponding trace data to an external host/debugger may be conducted without using functional network 121 and the various components 125 and functional network switches 123. Thus, thus since the operation of functional network 121 is not impeded by trace network 101, debug operations may thus avoid or minimize perturbances to system 100. Furthermore, since the operation of functional network 121 may continue unimpeded, debug operations may also be conducted without impediment, allowing for a more accurate view of system operations.

Figure 2:
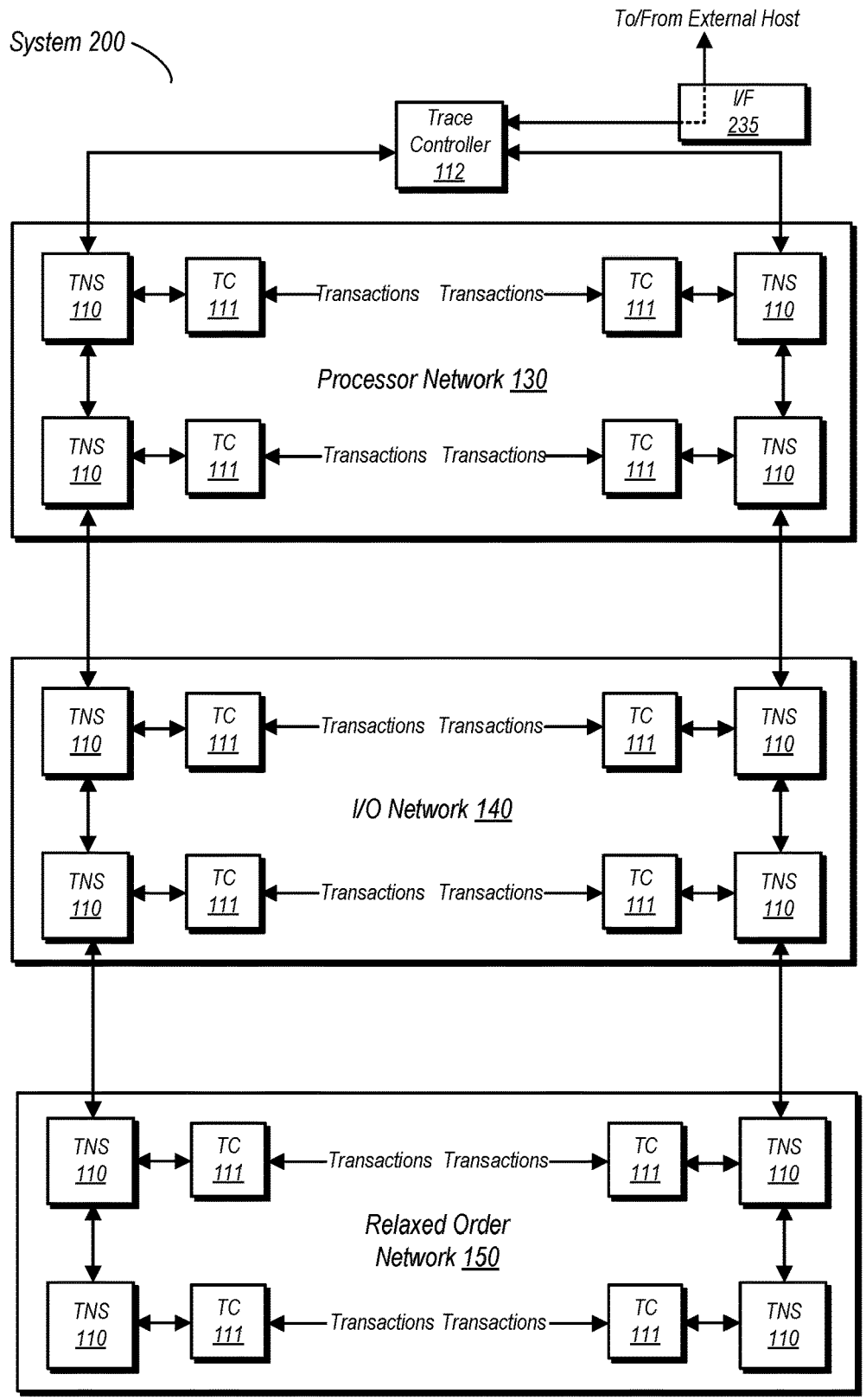
FIG. 2 is a block diagram of one embodiment of a system having a trace network coupled to multiple functional networks.
Figure 3:
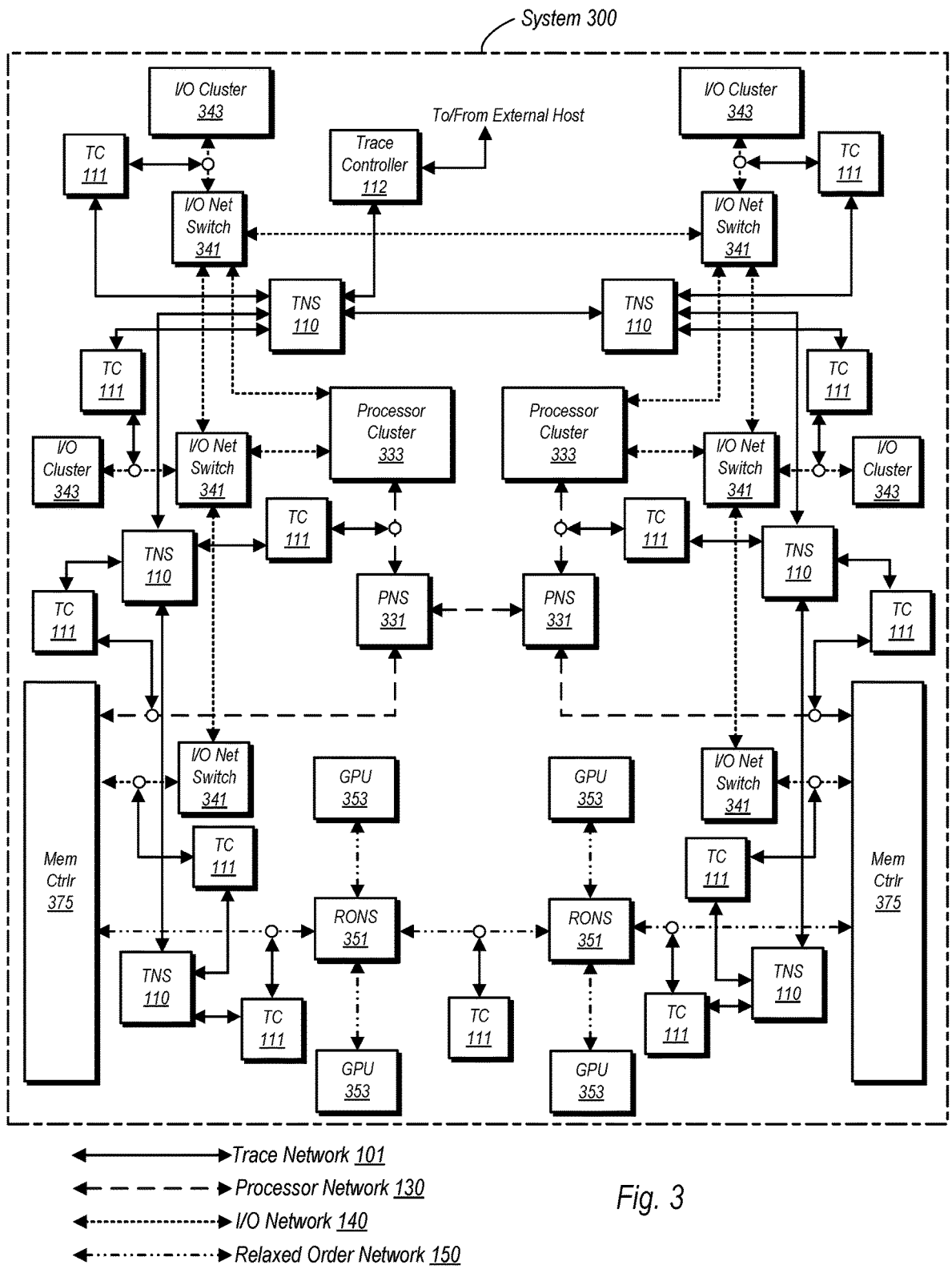
FIG. 3 is a block diagram of another embodiment of a system having a trace network coupled to multiple functional networks.

Systems with Trace Network and Multiple Functional Networks:

FIG. 2 is a block diagram of another embodiment of a system having a trace network. In the embodiment shown, system 200 includes a processor network 130, an I/O network 140, and a relaxed order network 150. An example illustrating additional details for these networks is shown in FIG. 3 and discussed below. A trace network comprising multiple instances of a trace circuit 111 and trace network switches 110 is coupled to each of these networks. As shown herein, the trace network includes a trace controller 112 coupled to various ones of the trace network switches 110.

Although not shown in this particular drawing, processor network 130 may include a number of different processors/processor cores interconnected by a number of network switches. The various processor cores may also be interconnected, via ones of the network switches, to one or more memory controllers. In one embodiment, processor network 130 may be implemented on at least one instance of a system-on-a-chip (SoC). In some embodiments, the SoC may implement a heterogenous multi-core processing complex, having different ones of the processing cores optimized for different objectives. For example, some processing cores may be optimized for high-performance operation to complete, e.g., computation intensive tasks. Other processing cores may be optimized for efficiency with respect to some metric (e.g., power consumption), and may be used primarily for operations that are less computationally intensive with respect to those that may be primarily performed by the high-performance cores. It is noted, however, embodiments in which a processor network 130 includes a number of homogenous processor cores are also possible and contemplated. Various instances of trace circuit 111 in the embodiment shown are coupled between the different functional units of processor network 130, and may thus monitor transactions between these units. Trace data comprising the transaction data may be conveyed from corresponding trace circuits 111, to trace controller 112 (discussed in further detail below), and subsequently to a host computer/debugger via an external interface.

I/O Network 140 may include a number of different I/O circuits and corresponding interfaces used by system 200 to facilitate communications with devices external thereto. The various I/O circuits may be interconnected to other ones of I/O network 140 by a number of network switches, and may also be coupled (via the network switches) to one or more memory controllers. Accordingly, I/O network 140 may include circuits such as Universal Serial Bus (USB) controllers, Peripheral Component Interconnect Express (PCIe) controllers, and various other types of circuits for serial and parallel interfaces. The various circuits of I/O network 140 may also be coupled by its network switches to one or more memory controllers. Similar to processor network discussed above, I/O network 140 may be implemented on one or more integrated circuit dies or instances of an SoC. Various instances of the trace circuits 111 are coupled between the functional units that make up I/O network 140. These trace circuits 111 may monitor transactions between corresponding agents on the trace network and convey corresponding trace data to trace controller 112.

Relaxed order network 150 in the illustrated embodiment is another functional network implemented in this embodiment of system 200. Processor network 130 and I/O network 140 may enforce certain ordering constraints (as expected by the processor cores and peripherals coupled to various interfaces) for, e.g., the purposes of coherency. However, relaxed order network 150 may be non-coherent and may thus not enforce the same ordering constraints as the other two networks. Relaxed order network 150 may include a number of graphics processing units (GPUs) interconnected by a number of network switches. The various GPUs may also be coupled to one or more memory controllers by the networks switches of relaxed order network 150, and may also be coupled by various ones of the corresponding network switches to one or more memory controllers. The GPUs of relaxed order network 150 in various embodiments may have dedicated bandwidth within that network and may not be constrained by the ordering that is enforced in the other two functional networks shown here. A number of trace circuits 111 of the trace networks are arranged to monitor traffic between the various functional units of relaxed order networks 150. Trace data that comprises the various transaction data monitored by trace circuits 111 may be conveyed, via correspondingly coupled ones of trace network switches 110, to trace controller 112.

In accordance with the discussion above, the trace network of this embodiment is coupled to each of the illustrated functional networks. The example embodiment of a trace network shown here includes a number of trace circuits 111, each of which is used as an observation point in one of the corresponding functional networks. The various ones of the trace circuits 111 are coupled to corresponding ones of a number of trace network switches 110. These trace network switches 110 may route trace data through the trace network to trace controller 112. Thus, the movement of trace data through system 200 may be conducted without using the networks switches or functional circuit blocks of the various functional networks, and thus without perturbing their operation.

Trace controller 112 in the embodiment shown may perform a number of functions for the trace network of system 200. One of the functions performed by trace controller is to assemble packets of trace data into frames that may then be conveyed through an external interface to a host computer/debugger. As previously noted, the packets of trace data conveyed from various ones of trace circuits 111 may be of various sizes. Similarly, trace controller 112 may assemble these packets into frames of varying sizes. Furthermore, the frames assembled by trace controller 112 may include packets from multiple ones of the trace circuits 111, including frames including packets received from trace circuits 111 associated with different ones of the functional networks. If necessary, trace controller 112 may add additional metadata to the frames to, e.g., enable the different packets of trace data therein to be identified. An assembled frame may then be transmitted by trace controller 112 to a host computer/debugger, where the trace data therein may be analyzed for debug purposes.

Trace controller 112 may also convey commands to the various trace network switches 110 and trace circuits 111 of the trace network. For example, trace controller 112 may convey commands to set a state for ones of the trace network switches 110, instruct a trace circuit 111 to monitor a particular set of transactions or monitor transactions at a particular time, convey trace data to the trace controller, and/or to connect a path between a particular trace circuit 111 and trace controller 112. Embodiments are possible and contemplated where at least some trace circuits 111 are configured to convey commands to a functional unit in a given functional network (e.g., to a processor core in processor network 130) to cause or test desired operations. Embodiments are also possible and contemplated in which trace controller 112 may query components of a given functional network for certain data (e.g., querying registers of a processor core), with the data being returned to a host computer/debugger. Generally speaking, in addition to conveying frames of trace data to a host computer/debugger, trace controller 112 may control the operation of the trace network to carry out desired trace and debug operations on system 200.

Trace controller 112 in the embodiment shown may convey the frames of trace data to the external host/debugger through interface 235. In one embodiment, interface 235 may be a multi-purpose I/O port that may be used for functions other than debug (and is thus not a dedicated debug port). The interface 234 may also be used for software trace data. However, embodiments are possible and contemplated in which a dedicated debug port is used to implement interface 235. Through interface 235, trace controller 112 may forward frames of trace data to the external host/debugger. Additionally, commands may be received via interface 235 by trace controller 112 to cause desired operations to be carried out in the trace network.

FIG. 3 is a block diagram of another embodiment of a system having a trace network. More particularly, FIG. 3 illustrates how the various components of one embodiment of a trace network are distributed among the components of the other functional networks.

In the embodiment shown, system 300 includes a trace network 101, a processor network 130, an I/O network 140, and a relaxed order network 150. Processor network 130 in the embodiment shown includes a number of processor clusters 333 and processor network switches 331. I/O network 140 in the embodiment shown includes a number of I/O clusters 343 and I/O network switches 341. Relaxed order network 150 includes a number of GPUs 353 and a number of relaxed order network switches 351. Trace network 101 includes a number of trace circuits 111, a number of trace network switches 110, and a trace controller 112. System 300 also includes a number of memory controllers 375 that are coupled to the other functional networks. These memory controllers 375 may be used to control read and write access to system memories (not shown here) that are implemented in or otherwise associated with system 300.

It is noted that the particular number of switches and components within each network in this drawing is illustrative, and is not intended to limit the disclosure in any way. The number of these various components and switches in the various networks and coupled thereto may vary from one embodiment to another.

The processor clusters 333 in the embodiment shown may include one or more processor cores of varying types. In accordance with the discussion above, the various types processor cores within the processor clusters 333 may differ from one another, with individual cores being optimized for achieving particular objectives (e.g., high performance for some cores, power efficient operation for others). Each processor cluster 333 may have at least one processor core of a given type. The processor networks switches 331 may couple the processor clusters 333 to one another, as well as to the memory controllers 375. With respect to trace network 101, a number of trace circuits 111 are arranged to monitor and record traffic between ones of processor network switches 311 and processor clusters 333. Additionally, a number of trace circuits 111 are arranged to monitor and record transactions between ones of processor network switches 331 and ones of memory controllers 375.

Ones of the I/O clusters 343 in the embodiment shown may include circuitry corresponding to one or more different interfaces to facilitate communications with entities external to system 300 (e.g., to various types of peripheral devices). The types of interfaces may include variants of the USB standard, PCI/PCIe interfaces, serial and parallel advanced technology attachment (SATA and PATA) interfaces, Firewire interfaces, and so on. The circuitry may include interface controllers, transmitters, receivers, buffers, and any other type of circuitry used in an interface. The various ones of the I/O network switches 341 in the embodiment shown may couple ones of the I/O clusters 343 to other ones of the I/O clusters 343. At least some of the I/O network switches 341 are also arranged to provide a communications path between ones of the I/O clusters 353 and ones of the processor clusters 333 of processor network 130, thus providing paths for inter-network communications. Particular ones of the I/O network switches 341 are also coupled to provide respective communications paths between various ones of the I/O clusters 343 and the memory controllers 375. With respect to trace network 101, various ones of trace circuits 111 are coupled to monitor and record traffic between ones of the I/O clusters 343 and correspondingly coupled ones of the I/O switches 341. Certain ones of the trace circuits 111 are also coupled to monitor and record traffic between ones of the I/O switches 341 and correspondingly coupled memory controllers 375.

Various ones of the GPUs 353 in the embodiment shown may implement graphics processing circuitry use for the generation of graphics to be displayed (e.g., still images, videos, icons, etc.). Various ones of the GPUs 353 may in some cases also be utilized for some processing tasks that are not related to graphics images, such as tasks that can utilize the parallel processing capacity provided by many GPUs. Communication between various ones of GPUs 353 may be facilitated by ones of the relaxed order network switches 351. The relaxed order network switches 351 may also provide communications paths between ones of the GPUs 353 and ones of the memory controllers 375. With respect to trace network 101, instances of trace circuit 111 are arranged to monitor and record traffic between ones of the GPUs 353 as well as traffic between various ones of the GPUs 353 and the memory controllers 375.

Trace network 101 in the embodiment shown includes a number of trace network switches configured to route trace data from ones of the trace circuits 111 to trace controller 112. The trace network switches 110 may also route commands from trace network 101 to particular ones of the trace circuits 111, as well as to other ones of the trace network switches. In some embodiments, trace network switches 110 may also route data to be used as test stimuli from trace controller 112 to selected ones of trace circuits 111. Trace networks switches 110 (as well as the switches of the other functional networks) may be implemented using any suitable type of switching circuitry/configuration.

The trace circuits 111 may each generate trace data based on monitoring and capturing traffic/transactions between source and destination components in a correspondingly coupled functional network of the system. By capturing the traffic, a trace circuit effectively copies the data/information of a transaction without impeding its progress between its source and destination. Accordingly, the various trace circuits 111 provide points of observation of traffic in system 300 that do not impact its operation. Various types of circuitry may be implemented within trace circuit 111 to aid in its operation. Such circuitry may include buffers (e.g., for temporary storage of observed traffic), receivers, transmitters, and so on. In some embodiments, trace circuits may also include timers, circuitry for generating time stamps (e.g., using a system timebase), and if necessary, circuitry for identifying a source and destination of a particular transaction. The trace circuits also control the monitoring trace start, pause, and stop conditions. Circuitry for organizing trace data into packets of varying sizes may also be included in various embodiments of trace circuit 111.

It is noted that the term "captured" as used herein is defined in a manner such that the "captured" data is replicated in a corresponding trace circuit, but may otherwise continue to its intended destination in its corresponding functional network. Accordingly, the use of the term "captured" is expressly not intended to indicate that the movement of data is impeded or that data transmitted on a functional network does not reach its intended destination, despite having been "captured" by a trace circuit. Instead, the use of the term "captured" is intended to convey that the data is copied by a trace circuit.

Trace circuits 111 may also include logic circuitry used for processing commands received from trace controller 112, and any other circuits that may be used to carry out these commands. Trace controller 112 may provide a number of different commands to a given trace circuit. For example, trace controller 112 may send commands to a trace circuit 111 to monitor and capture traffic during a particular time window, to capture traffic of certain types between two components of a particular functional network (e.g., write data to be conveyed from a processor cluster to a memory controller), and so on. Embodiments are also possible and contemplated wherein at least some trace circuits 111 may be configured to inject traffic into a particular one of the functional networks, e.g., as test stimuli, or to query functional components for certain data, such as information stored in registers.

As previously noted, trace controller 112 may, in at least some embodiments, use a multi-purpose interface for communications with a host computer/debugger external to system 300. Accordingly, trace controller 112 may be coupled directly to at least one of the I/O clusters 343. However, embodiments are possible and contemplated wherein trace controller 112 may communicate with an external host/debugger through a dedicated I/O port, such as a debug port under any current or future version of the JTAG (Joint Test Action Group) standard.

Figure 4:
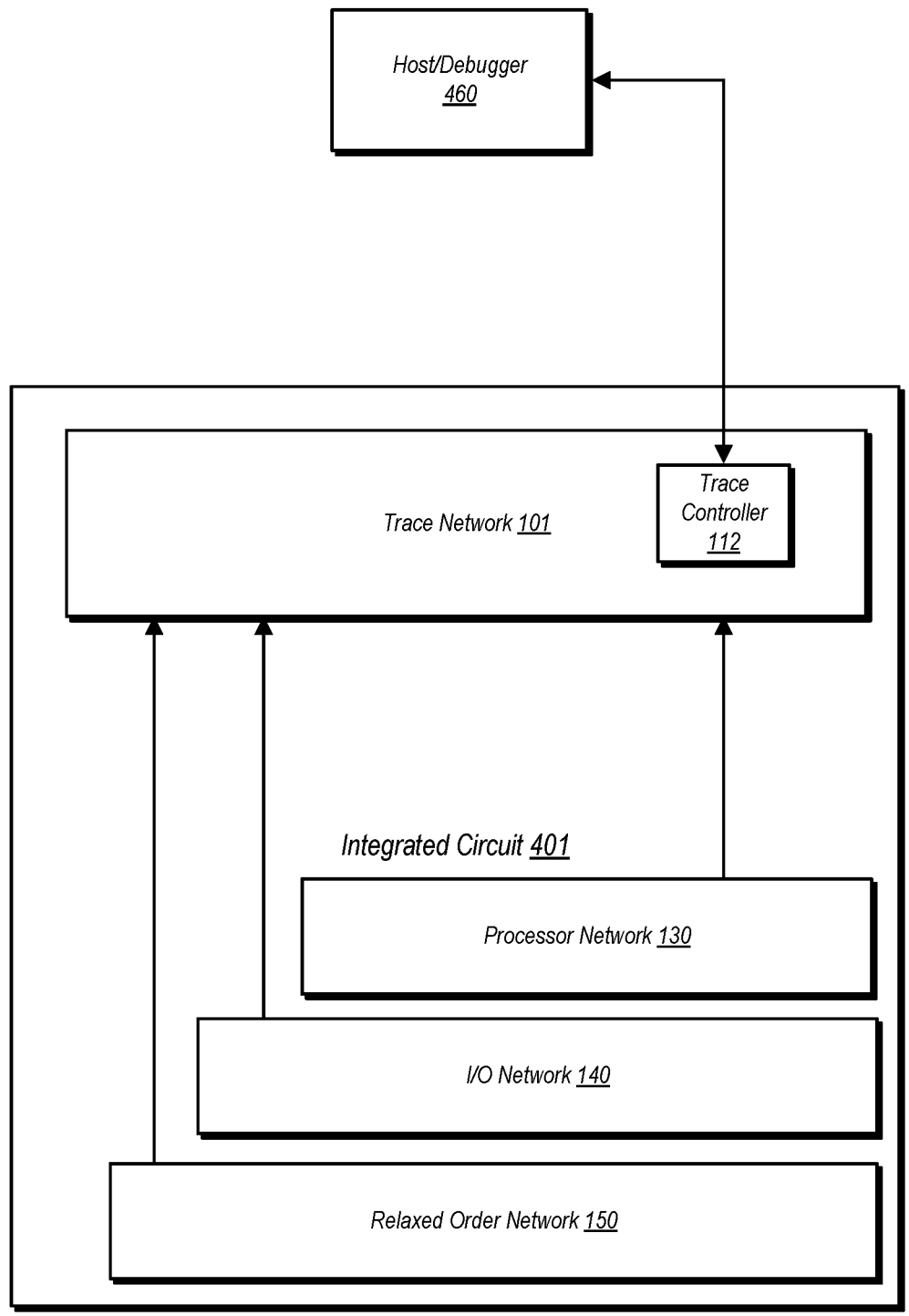
FIG. 4 is a block diagram of one embodiment of an integrated circuit having a trace network coupled to multiple functional networks.

FIG. 4 is a block diagram illustrating one embodiment of an integrated circuit upon which a system may be implemented in accordance with the discussion above. In the embodiment shown, integrated circuit 401 includes three functional networks—processor network 130, I/O network 140, and relaxed order network 150. Although not explicitly shown here, integrated circuit 401 may also include one or more memory controllers coupled to various components of the other functional networks. Furthermore, each of the functional networks may include various components and network switches such as those discussed above with reference to FIGS. 1-3.

Integrated circuit 401 also includes a trace network 101 coupled to each of the functional networks implemented on integrated circuit 401. Although not explicitly shown, trace network 101 may include a number of trace circuits 111 and trace network switches 110, similar to the embodiments discussed above. The trace circuits 111 may implement a number of observation points within the other ones of the functional networks to gather transaction data/information data. The trace network switches 110 may be used to provide communications paths between ones of the trace circuits 111 and the trace controller 112 to convey trace data, commands, and so on within trace network 101 and without impacting the operation of the various functional networks.

Trace controller 112 in the example shown is coupled to a host computer/debugger 460. Trace controller 112 may convey frames of trace data to host computer/debugger, which may be analyzed for debug and design purposes. Trace controller 112 may also receive commands from host computer/debugger 460. These commands may be used to instruct the trace network 101 to observe intra-network traffic for the various functional networks at different times or traffic of different types, for example. In some embodiments, host computer/debugger 460 may provide test stimuli to trace controller 112, which may then be forwarded to designated ones of the trace circuits 111. The response to the stimuli may be observed by various ones of the trace circuits 111 and returned to host computer/debugger 460, via trace controller 112, within packets/frames of trace data.

In various embodiments, multiple instances of integrated circuit 401 may be implemented in a scalable system. One embodiment of such a system is now discussed with reference to FIG. 5.

Figure 5:
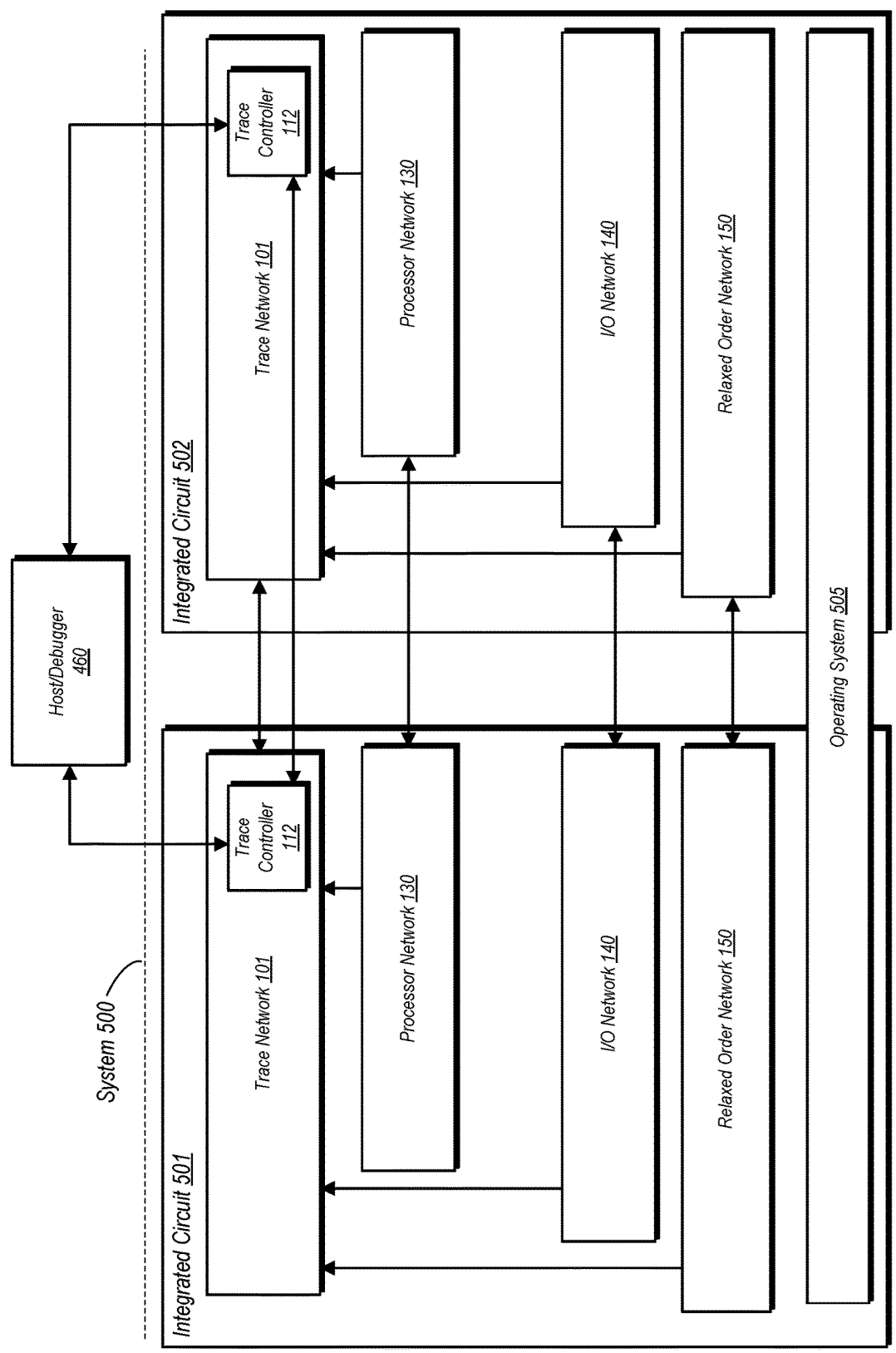
FIG. 5 is a block diagram of one embodiment of a system having multiple integrated circuits with a trace network and multiple functional networks implemented across both.

FIG. 5 is a block diagram of another system embodiment in which two integrated circuits are provided. Integrated circuits 501 and 502 in the embodiment shown may be similarly or identically configured, and may be part of a scalable system. That is, integrated circuits 501 and 502 may be part of a system in which the operational capacity may be appropriately scaled by providing a desired number of like or similarly configured integrated circuits. Although two instances of a particular type of integrated circuit are shown in FIG. 2, the present disclosure contemplates a scalable system using 1, 2, 4, 8, or any other desired number of integrated circuits. Because of the function fabric scaling, the trace network is also made to scale through the trace circuits, trace switches, and trace controller placed at key locations.

Each of integrated circuits 501 and 502 in the embodiment shown includes three functional networks, processor network 130, I/O network 140, and relaxed order network 150. Embodiments having other types and different numbers of functional networks are possible and contemplated. The functional networks on integrated circuits 501 and 502 may communicate with one another, effectively creating larger versions of these networks. Thus, in a scalable system, a given functional network may span over the number of these integrated circuits/dies implemented in the system.

Each of integrated circuits 501 and 502 also includes a trace network 101 having a corresponding trace controller 112. Similar to the functional networks, the trace networks 101 of integrated circuits 501 and 502 may communicate with one another. Furthermore, the trace controllers 112 may communicate directly with one another in some embodiments, including the one shown here. In some embodiments, a given one of the trace controllers 112 may act as a primary trace controller while the other (or other ones of) trace controller may operate in a secondary role under the control of the primary. However, the two trace controllers 112 may also independently control their respective trace networks, including with regard to communication with host computer/debugger 460.

In the embodiment shown, an operating system 505 may execute across both of integrated circuits 501 and 502. As previously noted, integrated circuit dies 501 and 502 may be implemented as a scalable system. Accordingly, integrated circuit dies 501 and 502 may be configured as a single system in which the existence of the multiple integrated circuit dies is transparent to software executing on that system, such as the operating system 505. In such embodiments of the system, if both integrated circuit dies 501 and 502 include respective processor cores, software executing thereon may see these two dies as a single entity having multiple processor cores, and is thus effectively unaware that it is being executed across multiple integrated circuit dies. However, irrespective of the number of integrated circuit dies used in a given scalable system embodiment, this number may remain transparent with respect to software executing thereon.

Figure 6:
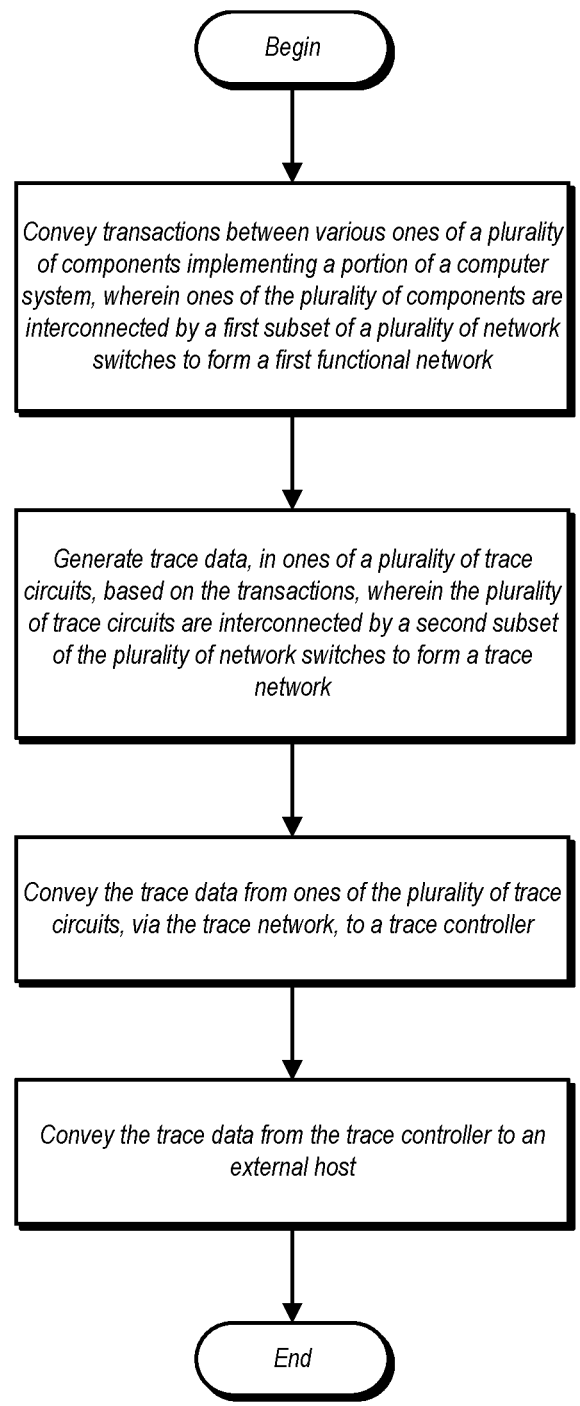
FIG. 6 is a flow diagram of one embodiment of a method for operating a trace network.

Operational Method Flow:

FIG. 6 is a flow diagram illustrating one embodiment of a method for operating a trace network on a system having one or more functional networks. Method 600 as disclosed herein may be carried out by any of the embodiments discussed above, including the multi-die embodiment of FIG. 5. Embodiments of a system not explicitly discussed herein but nevertheless capable of carrying out Method 600 are also considered to fall within the scope of this disclosure.

Method 600 includes conveying transactions between various ones of a plurality of components implementing a portion of a computer system, wherein ones of the plurality of components are interconnected by a plurality of functional network switches to form a first functional network (block 605). The method further includes generating trace data, in ones of a plurality of trace circuits, based on the transactions, wherein the plurality of trace circuits are interconnected by a plurality of trace network switches to form a trace network (block 610). After generation of the trace data (e.g., by copying traffic between components of a functional network), the method continues with conveying the trace data from the ones of the plurality of trace circuits, via the trace network, to a trace controller (block 615) and conveying the trace data from the trace controller to an external host (block 620).

In various embodiments, the method includes conveying trace data in packets, to the trace controller, from ones of the plurality of trace circuits. Thereafter, the method continues with the assembling of the trace data into frames, using the trace controller, wherein at least some frames of trace data comprise packets of trace data received from two or more of the plurality of trace circuits. The method also includes conveying the frames to the external host via an input/output (I/O) port.

Embodiments of the method are contemplated wherein generating trace data comprises duplicating data from transactions conveyed on a processor network, wherein the processor network comprises a plurality of processors interconnected with one another and a plurality of memory controllers by ones of the plurality of functional network switches. Embodiments of the method are also contemplated wherein generating trace data comprises duplicating data from transactions conveyed on an input/output (I/O) network, wherein the I/O network comprises a plurality of I/O circuits interconnected with one another and a plurality of memory controllers by ones of the plurality of functional network switches. Such embodiments may of the method may also include duplicating data from transactions conveyed on a relaxed order network, wherein the relaxed order network comprises a plurality of graphic processing units (GPUs) interconnected with one another and plurality of memory controllers by ones of the plurality of functional network switches.

In some embodiments, conveying the trace data from the ones of the plurality of trace circuits, via the trace network, to a trace controller comprises conveying trace data between a first integrated circuit die and a second integrated circuit die.

Figure 7:
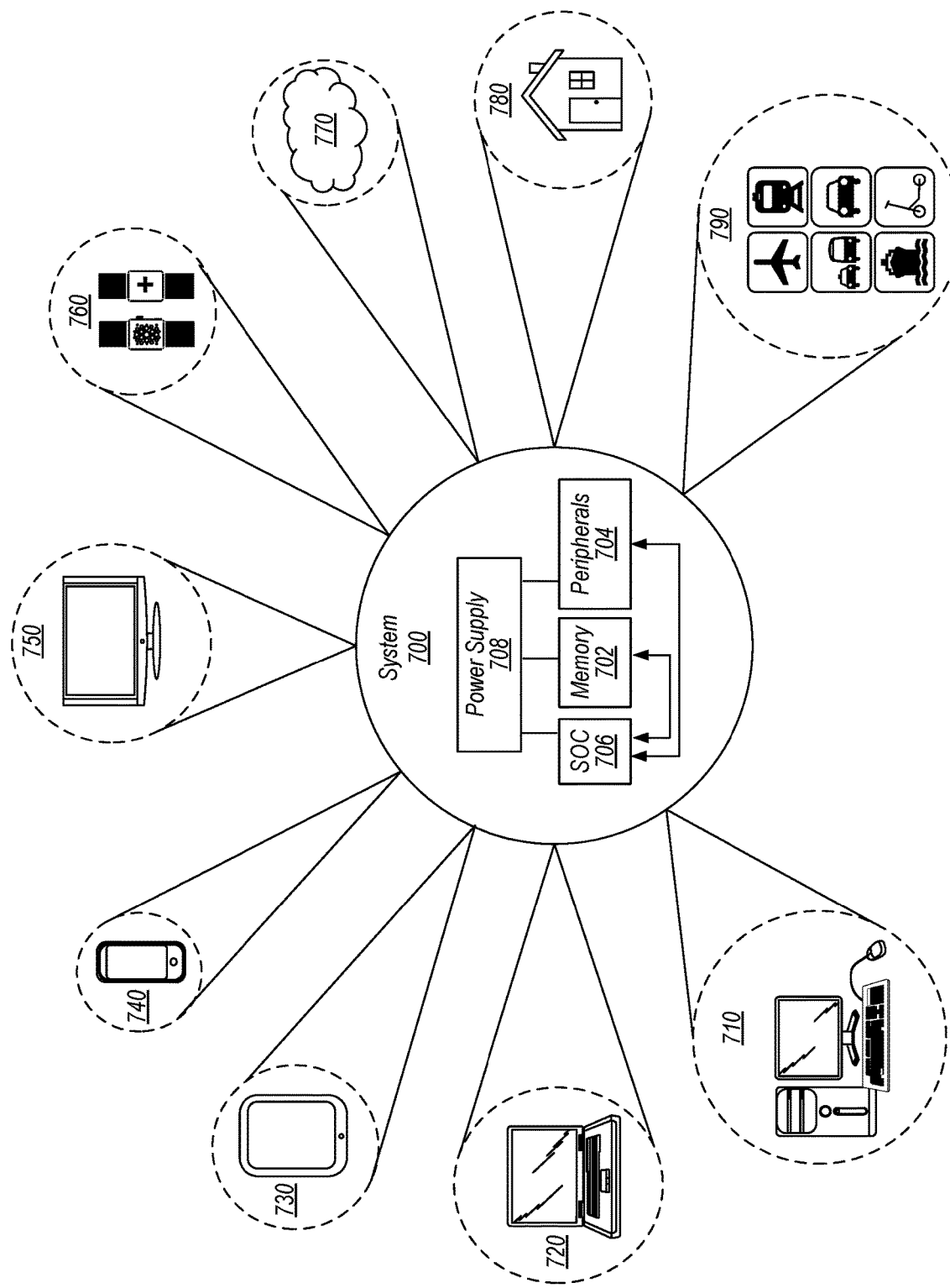
FIG. 7 is a block diagram of an example system.

Example System:

Turning next to FIG. 7, a block diagram of one embodiment of a system 700 is shown that may incorporate and/or otherwise utilize the methods and mechanisms described herein. In the illustrated embodiment, the system 700 includes at least one instance of a system on chip (SoC) 706 which may include multiple types of processing units, such as a central processing unit (CPU), a graphics processing unit (GPU), or otherwise, a communication fabric, and interfaces to memories and input/output devices.

In various embodiments, system 700 may include one or integrated circuits that implement a number of functional networks and a trace network in accordance with the discussion above. The functional networks and the trace network may, for example, be implemented on an SoC using a single integrated circuit die. Embodiments of a scalable system in which multiple instances of an SoC are used to form a system are also possible and contemplated, and thus the functional networks and corresponding trace network may span multiple integrated circuit dies.

A power supply 708 is also provided which supplies the supply voltages to SoC 706 as well as one or more supply voltages to the memory 702 and/or the peripherals 704. In various embodiments, power supply 708 represents a battery (e.g., a rechargeable battery in a smart phone, laptop or tablet computer, or other device). In some embodiments, more than one instance of SoC 706 is included (and more than one external memory 702 is included as well).

The memory 702 is any type of memory, such as dynamic random access memory (DRAM), synchronous DRAM (SDRAM), double data rate (DDR, DDR2, DDR3, etc.) SDRAM (including mobile versions of the SDRAMs such as mDDR3, etc., and/or low power versions of the SDRAMs such as LPDDR2, etc.), RAIVIBUS DRAM (RDRAM), static RAM (SRAM), etc. One or more memory devices are coupled onto a circuit board to form memory modules such as single inline memory modules (SIMMs), dual inline memory modules (DIMMs), etc. Alternatively, the devices are mounted with a SoC or an integrated circuit in a chip-on-chip configuration, a package-on-package configuration, or a multi-chip module configuration.

The peripherals 704 include any desired circuitry, depending on the type of system 700. For example, in one embodiment, peripherals 704 includes devices for various types of wireless communication, such as Wi-Fi, Bluetooth, cellular, global positioning system, etc. In some embodiments, the peripherals 704 also include additional storage, including RAM storage, solid state storage, or disk storage. The peripherals 704 include user interface devices such as a display screen, including touch display screens or multi-touch display screens, keyboard or other input devices, microphones, speakers, etc.

As illustrated, system 700 is shown to have application in a wide range of areas. For example, system 700 may be utilized as part of the chips, circuitry, components, etc., of a desktop computer 710, laptop computer 720, tablet computer 730, cellular or mobile phone 740, or television 750 (or set-top box coupled to a television). Also illustrated is a smartwatch and health monitoring device 760. In some embodiments, smartwatch may include a variety of general-purpose computing related functions. For example, smartwatch may provide access to email, cellphone service, a user calendar, and so on. In various embodiments, a health monitoring device may be a dedicated medical device or otherwise include dedicated health related functionality. For example, a health monitoring device may monitor a user's vital signs, track proximity of a user to other users for the purpose of epidemiological social distancing, contact tracing, provide communication to an emergency service in the event of a health crisis, and so on. In various embodiments, the above-mentioned smartwatch may or may not include some or any health monitoring related functions. Other wearable devices are contemplated as well, such as devices worn around the neck, devices that are implantable in the human body, glasses designed to provide an augmented and/or virtual reality experience, and so on.

System 700 may further be used as part of a cloud-based service(s) 770. For example, the previously mentioned devices, and/or other devices, may access computing resources in the cloud (i.e., remotely located hardware and/or software resources). Still further, system 700 may be utilized in one or more devices of a home other than those previously mentioned. For example, appliances within the home may monitor and detect conditions that warrant attention. For example, various devices within the home (e.g., a refrigerator, a cooling system, etc.) may monitor the status of the device and provide an alert to the homeowner (or, for example, a repair facility) should a particular event be detected. Alternatively, a thermostat may monitor the temperature in the home and may automate adjustments to a heating/cooling system based on a history of responses to various conditions by the homeowner. Also illustrated in FIG. 7 is the application of system 700 to various modes of transportation. For example, system 700 may be used in the control and/or entertainment systems of aircraft, trains, buses, cars for hire, private automobiles, waterborne vessels from private boats to cruise liners, scooters (for rent or owned), and so on. In various cases, system 700 may be used to provide automated guidance (e.g., self-driving vehicles), general systems control, and otherwise. These any many other embodiments are possible and are contemplated. It is noted that the devices and applications illustrated in FIG. 7 are illustrative only and are not intended to be limiting. Other devices are possible and are contemplated.

The present disclosure includes references to "an embodiment" or groups of "embodiments" (e.g., "some embodiments" or "various embodiments"). Embodiments are different implementations or instances of the disclosed concepts. References to "an embodiment," "one embodiment," "a particular embodiment," and the like do not necessarily refer to the same embodiment. A large number of possible embodiments are contemplated, including those specifically disclosed, as well as modifications or alternatives that fall within the spirit or scope of the disclosure.

This disclosure may discuss potential advantages that may arise from the disclosed embodiments. Not all implementations of these embodiments will necessarily manifest any or all of the potential advantages. Whether an advantage is realized for a particular implementation depends on many factors, some of which are outside the scope of this disclosure. In fact, there are a number of reasons why an implementation that falls within the scope of the claims might not exhibit some or all of any disclosed advantages. For example, a particular implementation might include other circuitry outside the scope of the disclosure that, in conjunction with one of the disclosed embodiments, negates or diminishes one or more the disclosed advantages. Furthermore, suboptimal design execution of a particular implementation (e.g., implementation techniques or tools) could also negate or diminish disclosed advantages. Even assuming a skilled implementation, realization of advantages may still depend upon other factors such as the environmental circumstances in which the implementation is deployed. For example, inputs supplied to a particular implementation may prevent one or more problems addressed in this disclosure from arising on a particular occasion, with the result that the benefit of its solution may not be realized. Given the existence of possible factors external to this disclosure, it is expressly intended that any potential advantages described herein are not to be construed as claim limitations that must be met to demonstrate infringement. Rather, identification of such potential advantages is intended to illustrate the type(s) of improvement available to designers having the benefit of this disclosure. That such advantages are described permissively (e.g., stating that a particular advantage "may arise") is not intended to convey doubt about whether such advantages can in fact be realized, but rather to recognize the technical reality that realization of such advantages often depends on additional factors.

Unless stated otherwise, embodiments are non-limiting. That is, the disclosed embodiments are not intended to limit the scope of claims that are drafted based on this disclosure, even where only a single example is described with respect to a particular feature. The disclosed embodiments are intended to be illustrative rather than restrictive, absent any statements in the disclosure to the contrary. The application is thus intended to permit claims covering disclosed embodiments, as well as such alternatives, modifications, and equivalents that would be apparent to a person skilled in the art having the benefit of this disclosure.

For example, features in this application may be combined in any suitable manner. Accordingly, new claims may be formulated during prosecution of this application (or an application claiming priority thereto) to any such combination of features. In particular, with reference to the appended claims, features from dependent claims may be combined with those of other dependent claims where appropriate, including claims that depend from other independent claims. Similarly, features from respective independent claims may be combined where appropriate.

Accordingly, while the appended dependent claims may be drafted such that each depends on a single other claim, additional dependencies are also contemplated. Any combinations of features in the dependent that are consistent with this disclosure are contemplated and may be claimed in this or another application. In short, combinations are not limited to those specifically enumerated in the appended claims.

Where appropriate, it is also contemplated that claims drafted in one format or statutory type (e.g., apparatus) are intended to support corresponding claims of another format or statutory type (e.g., method).

Because this disclosure is a legal document, various terms and phrases may be subject to administrative and judicial interpretation. Public notice is hereby given that the following paragraphs, as well as definitions provided throughout the disclosure, are to be used in determining how to interpret claims that are drafted based on this disclosure.

References to a singular form of an item (i.e., a noun or noun phrase preceded by "a," "an," or "the") are, unless context clearly dictates otherwise, intended to mean "one or more." Reference to "an item" in a claim thus does not, without accompanying context, preclude additional instances of the item. A "plurality" of items refers to a set of two or more of the items.

The word "may" is used herein in a permissive sense (i.e., having the potential to, being able to) and not in a mandatory sense (i.e., must).

The terms "comprising" and "including," and forms thereof, are open-ended and mean "including, but not limited to."

When the term "or" is used in this disclosure with respect to a list of options, it will generally be understood to be used in the inclusive sense unless the context provides otherwise. Thus, a recitation of "x or y" is equivalent to "x or y, or both," and thus covers 1) x but not y, 2) y but not x, and 3) both x and y. On the other hand, a phrase such as "either x or y, but not both" makes clear that "or" is being used in the exclusive sense.

A recitation of "w, x, y, or z, or any combination thereof" or "at least one of . . . w, x, y, and z" is intended to cover all possibilities involving a single element up to the total number of elements in the set. For example, given the set [w, x, y, z], these phrasings cover any single element of the set (e.g., w but not x, y, or z), any two elements (e.g., w and x, but not y or z), any three elements (e.g., w, x, and y, but not z), and all four elements. The phrase "at least one of . . . w, x, y, and z" thus refers to at least one element of the set [w, x, y, z], thereby covering all possible combinations in this list of elements. This phrase is not to be interpreted to require that there is at least one instance of w, at least one instance of x, at least one instance of y, and at least one instance of z.

Various "labels" may precede nouns or noun phrases in this disclosure. Unless context provides otherwise, different labels used for a feature (e.g., "first circuit," "second circuit," "particular circuit," "given circuit," etc.) refer to different instances of the feature. Additionally, the labels "first," "second," and "third" when applied to a feature do not imply any type of ordering (e.g., spatial, temporal, logical, etc.), unless stated otherwise.

The phrase "based on" or is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

The phrases "in response to" and "responsive to" describe one or more factors that trigger an effect. This phrase does not foreclose the possibility that additional factors may affect or otherwise trigger the effect, either jointly with the specified factors or independent from the specified factors. That is, an effect may be solely in response to those factors, or may be in response to the specified factors as well as other, unspecified factors. Consider the phrase "perform A in response to B." This phrase specifies that B is a factor that triggers the performance of A, or that triggers a particular result for A. This phrase does not foreclose that performing A may also be in response to some other factor, such as C. This phrase also does not foreclose that performing A may be jointly in response to B and C. This phrase is also intended to cover an embodiment in which A is performed solely in response to B. As used herein, the phrase "responsive to" is synonymous with the phrase "responsive at least in part to." Similarly, the phrase "in response to" is synonymous with the phrase "at least in part in response to."

Within this disclosure, different entities (which may variously be referred to as "units," "circuits," other components, etc.) may be described or claimed as "configured" to perform one or more tasks or operations. This formulation [entity] configured to [perform one or more tasks] is used herein to refer to structure (i.e., something physical). More specifically, this formulation is used to indicate that this structure is arranged to perform the one or more tasks during operation. A structure can be said to be "configured to"

perform some tasks even if the structure is not currently being operated. Thus, an entity described or recited as being "configured to" perform some task refers to something physical, such as a device, circuit, a system having a processor unit and a memory storing program instructions executable to implement the task, etc. This phrase is not used herein to refer to something intangible.

In some cases, various units/circuits/components may be described herein as performing a set of tasks or operations. It is understood that those entities are "configured to" perform those tasks/operations, even if not specifically noted.

The term "configured to" is not intended to mean "configurable to." An unprogrammed FPGA, for example, would not be considered to be "configured to" perform a particular function. This unprogrammed FPGA may be "configurable to" perform that function, however. After appropriate programming, the FPGA may then be said to be "configured to" perform the particular function.

For purposes of United States patent applications based on this disclosure, reciting in a claim that a structure is "configured to" perform one or more tasks is expressly intended not to invoke 35 U.S.C. § 112(f) for that claim element. Should Applicant wish to invoke Section 112(f) during prosecution of a United States patent application based on this disclosure, it will recite claim elements using the "means for" [performing a function] construct.

Different "circuits" may be described in this disclosure. These circuits or "circuitry" constitute hardware that includes various types of circuit elements, such as combinatorial logic, clocked storage devices (e.g., flip-flops, registers, latches, etc.), finite state machines, memory (e.g., random-access memory, embedded dynamic random-access memory), programmable logic arrays, and so on. Circuitry may be custom designed, or taken from standard libraries. In various implementations, circuitry can, as appropriate, include digital components, analog components, or a combination of both. Certain types of circuits may be commonly referred to as "units" (e.g., a decode unit, an arithmetic logic unit (ALU), functional unit, memory management unit (MMU), etc.). Such units also refer to circuits or circuitry.

The disclosed circuits/units/components and other elements illustrated in the drawings and described herein thus include hardware elements such as those described in the preceding paragraph. In many instances, the internal arrangement of hardware elements within a particular circuit may be specified by describing the function of that circuit. For example, a particular "decode unit" may be described as performing the function of "processing an opcode of an instruction and routing that instruction to one or more of a plurality of functional units," which means that the decode unit is "configured to" perform this function. This specification of function is sufficient, to those skilled in the computer arts, to connote a set of possible structures for the circuit.

In various embodiments, as discussed in the preceding paragraph, circuits, units, and other elements defined by the functions or operations that they are configured to implement, The arrangement and such circuits/units/components with respect to each other and the manner in which they interact form a microarchitectural definition of the hardware that is ultimately manufactured in an integrated circuit or programmed into an FPGA to form a physical implementation of the microarchitectural definition. Thus, the microarchitectural definition is recognized by those of skill in the art as structure from which many physical implementations may be derived, all of which fall into the broader structure described by the microarchitectural definition. That is, a skilled artisan presented with the microarchitectural definition supplied in accordance with this disclosure may, without undue experimentation and with the application of ordinary skill, implement the structure by coding the description of the circuits/units/components in a hardware description language (HDL) such as Verilog or VHDL. The HDL description is often expressed in a fashion that may appear to be functional. But to those of skill in the art in this field, this HDL description is the manner that is used transform the structure of a circuit, unit, or component to the next level of implementational detail. Such an HDL description may take the form of behavioral code (which is typically not synthesizable), register transfer language (RTL) code (which, in contrast to behavioral code, is typically synthesizable), or structural code (e.g., a netlist specifying logic gates and their connectivity). The HDL description may subsequently be synthesized against a library of cells designed for a given integrated circuit fabrication technology, and may be modified for timing, power, and other reasons to result in a final design database that is transmitted to a foundry to generate masks and ultimately produce the integrated circuit. Some hardware circuits or portions thereof may also be custom-designed in a schematic editor and captured into the integrated circuit design along with synthesized circuitry. The integrated circuits may include transistors and other circuit elements (e.g. passive elements such as capacitors, resistors, inductors, etc.) and interconnect between the transistors and circuit elements. Some embodiments may implement multiple integrated circuits coupled together to implement the hardware circuits, and/or discrete elements may be used in some embodiments. Alternatively, the HDL design may be synthesized to a programmable logic array such as a field programmable gate array (FPGA) and may be implemented in the FPGA. This decoupling between the design of a group of circuits and the subsequent low-level implementation of these circuits commonly results in the scenario in which the circuit or logic designer never specifies a particular set of structures for the low-level implementation beyond a description of what the circuit is configured to do, as this process is performed at a different stage of the circuit implementation process.

The fact that many different low-level combinations of circuit elements may be used to implement the same specification of a circuit results in a large number of equivalent structures for that circuit. As noted, these low-level circuit implementations may vary according to changes in the fabrication technology, the foundry selected to manufacture the integrated circuit, the library of cells provided for a particular project, etc. In many cases, the choices made by different design tools or methodologies to produce these different implementations may be arbitrary.

Moreover, it is common for a single implementation of a particular functional specification of a circuit to include, for a given embodiment, a large number of devices (e.g., millions of transistors). Accordingly, the sheer volume of this information makes it impractical to provide a full recitation of the low-level structure used to implement a single embodiment, let alone the vast array of equivalent possible implementations. For this reason, the present disclosure describes structure of circuits using the functional shorthand commonly employed in the industry.

Numerous variations and modifications will become apparent to those skilled in the art once the above disclosure is fully appreciated. It is intended that the following claims be interpreted to embrace all such variations and modifications.

What is claimed is:

1. An apparatus comprising:
a computer system, wherein the computer system includes:
at least one functional network that includes a plurality of component circuits interconnected by ones of a plurality of functional network switches, wherein ones of the plurality of component circuits are configured to convey transactional traffic between each other, and
a trace network configured to convey trace data that is based on the transactional traffic and includes metadata that is distinct from the transactional traffic, wherein the trace data enables performance of debug operations of the computer system, and wherein the trace network includes:
a plurality of trace circuits configured to generate the trace data; and
a plurality of trace network switches, wherein ones of the plurality of trace circuits are interconnected by ones of the plurality of trace network switches, wherein ones of the plurality of trace circuits are configured to convey the trace data to a debug interface via the trace network without using the at least one functional network.

2. The apparatus of claim 1, further comprising a trace controller configured to receive the trace data from ones of the plurality of trace circuits and further configured to convey the trace data to the debug interface.

3. The apparatus of claim 2, wherein the trace controller is configured to generate frames of trace data using ones of a plurality of packets having trace data received from different ones of the plurality of trace circuits.

4. The apparatus of claim 2, wherein ones of the plurality of trace circuits are configured to convey the trace data to the trace controller in packets, wherein at least some packets have a different size with respect to other packets.

5. The apparatus of claim 1, wherein at least a subset of the plurality of functional network switches are configured to interconnect a plurality of processor cores and a plurality of memory controllers to form a processor network.

6. The apparatus of claim 1, wherein at least a subset of the plurality of functional network switches are configured to interconnect a plurality of input/output (I/O) circuits and a plurality of memory controllers to form an I/O network.

7. The apparatus of claim 1, wherein at least a subset of the plurality of functional network switches are configured to interconnect a plurality of graphics processing units (GPUs) and a plurality of memory controllers to form a relaxed order network.

8. The apparatus of claim 1, wherein at least a portion of the functional network and a portion of the trace network are implemented on a single integrated circuit die.

9. The apparatus of claim 1, wherein the debug interface is a multi-purpose input/output (I/O) port, and wherein the trace network further comprises a trace controller configured to convey the trace data to an external debugger via the multi-purpose I/O port.

10. A method comprising:
conveying transactional traffic between various ones of a plurality of component circuits implementing a portion of a computer system, wherein ones of the plurality of component circuits are interconnected by a plurality of functional network switches to form a first functional network;
generating trace data, in ones of a plurality of trace circuits, based on the transactional traffic, wherein ones of the plurality of trace circuits are interconnected by a plurality of trace network switches to form a trace network, and wherein the trace data enables performance of debug operations of the computer system and includes metadata that is distinct from the transactional traffic;
conveying the trace data from the ones of the plurality of trace circuits, via the trace network, to a trace controller; and
conveying the trace data from the trace controller to an external host.

11. The method of claim 10, wherein the trace data is conveyed to the trace controller in packets, and wherein the method further comprises:
assembling the trace data into frames, using the trace controller, wherein at least some frames of trace data comprise packets of trace data received from two or more of the plurality of trace circuits; and
conveying the frames to the external host via an input/output (I/O) port.

12. The method of claim 10, wherein the generating of the trace data comprises duplicating data from transactions conveyed on a processor network, wherein the processor network comprises a plurality of processors interconnected with one another and a plurality of memory controllers by ones of the plurality of functional network switches.

13. The method of claim 10, wherein the generating of the trace data comprises duplicating data from transactions conveyed on an input/output (I/O) network, wherein the I/O network comprises a plurality of I/O circuits interconnected with one another and a plurality of memory controllers by ones of the plurality of functional network switches.

14. The method of claim 10, wherein the generating of the trace data comprises duplicating data from transactions conveyed on a relaxed order network, wherein the relaxed order network comprises a plurality of graphic processing units (GPUs) interconnected with one another and a plurality of memory controllers by ones of the plurality of functional network switches.

15. The method of claim 10, wherein the conveying of the trace data from the ones of the plurality of trace circuits, via the trace network, to a trace controller comprises conveying trace data between a first integrated circuit die and a second integrated circuit die.

16. A system comprising:
a plurality of component circuits implementing a portion of a computer system on at least one integrated circuit die, wherein ones of the plurality of component circuits are configured to convey transactional traffic between each other;
a plurality of trace circuits implemented on the at least one integrated circuit die; and
a plurality of network switches comprising:
a plurality of functional network switches interconnected to form at least one functional network between ones of the plurality of component circuits; and
a plurality of trace network switches interconnected to form a trace network between ones of the plurality of trace circuits, wherein ones of the plurality of trace circuits are configured to generate trace data based on the transactional traffic and further configured to convey the trace data, via the trace network and independent of the at least one functional network, to a host computer external to the at least one integrated circuit die, wherein the trace data enables performance of debug operations of the computer system and includes metadata that is distinct from the transactional traffic.

17. The system of claim 16, wherein the trace network further includes a trace controller configured to receive the trace data from ones of the plurality of trace circuits and further configured to convey the trace data to the host computer via an interface of the at least one integrated circuit die.

18. The system of claim 16, further comprising a plurality of functional networks including:
 a processor network comprising a plurality of processor cores interconnected with one another using a first subset of the plurality of functional network switches;
 an input/output (I/O) network comprising a plurality of I/O circuits interconnected with one another using a second subset of the plurality of functional network switches; and
 a relaxed order network comprising a plurality of graphics processing units (GPUs) interconnected with one another using a third subset of the plurality of functional network switches.

19. The system as recited in claim 18, wherein the at least one integrated circuit die comprises one or more memory controllers coupled to the processor network, the I/O network, and the relaxed order network via selected ones of the plurality of functional network switches.

20. The system of claim 16, wherein the trace network and the at least one functional network are scalable from a single integrated circuit die to at least two integrated circuit dies, wherein the at least two integrated circuit dies are configured as a single system in which existence of multiple integrated circuit dies is transparent to software executing on the single system.

* * * * *